United States Patent [19]

Yudichak et al.

[11] Patent Number: 4,656,626

[45] Date of Patent: Apr. 7, 1987

[54] APPARATUS AND METHOD FOR PROVIDING DYNAMICALLY ASSIGNED SWITCH PATHS

[75] Inventors: Joseph R. Yudichak, Madison; Herbert J. Toegel, Middlebury, both of Conn.

[73] Assignee: ITT Corporation, New York, N.Y.

[21] Appl. No.: 682,033

[22] Filed: Dec. 14, 1984

[51] Int. Cl.$^4$ .................. H04Q 11/04; H04J 3/00; G11C 15/49

[52] U.S. Cl. ........................ 370/68; 370/99; 365/49

[58] Field of Search ............ 370/99, 94, 92, 58, 370/112, 68; 365/49, 230

[56] References Cited

U.S. PATENT DOCUMENTS

| | | | |
|---|---|---|---|
| 3,927,396 | 12/1975 | Le Can | 365/49 |
| 4,168,541 | 9/1979 | Dekarske | 365/49 |
| 4,219,883 | 8/1980 | Kobayashi et al. | 365/49 |
| 4,244,033 | 1/1981 | Hattori | 365/49 |
| 4,320,501 | 3/1982 | Le Dieu et al. | 370/68 |
| 4,467,470 | 8/1984 | Waas | 370/68 |
| 4,512,014 | 4/1985 | Binz et al. | 370/68 |

*Primary Examiner*—Douglas W. Olms
*Assistant Examiner*—Frank M. Scutch, III
*Attorney, Agent, or Firm*—Peter C. Van Der Sluys

[57] ABSTRACT

A CAM/RAM/CAM memory array is used to provide dynamic space and time switching between a plurality of sources and destinations. The memory array includes a source CAM portion, a destination CAM portion and a data RAM portion with each row forming a word. In order to establish a path, a source address is stored in the source CAM portion of a word and a destination address is stored in the destination CAM portion of the same word. When data is to be switched, the data source address is presented to the source CAM on a TDM address bus to address a word having the same source address. The data is then written into the RAM of the addressed word from a data bus, if an address comparison is found. The address of the destination is time division multiplexed to the destination CAM via a destination address bus. If the address of the data destination on the address bus matches a stored address, the data RAM associated with the address is enabled and read to the data bus for delivery to the data destination. Means are further provided to dynamically assign and unassign addresses to and from words in the memory array to thereby dynamically establish switch paths.

24 Claims, 11 Drawing Figures

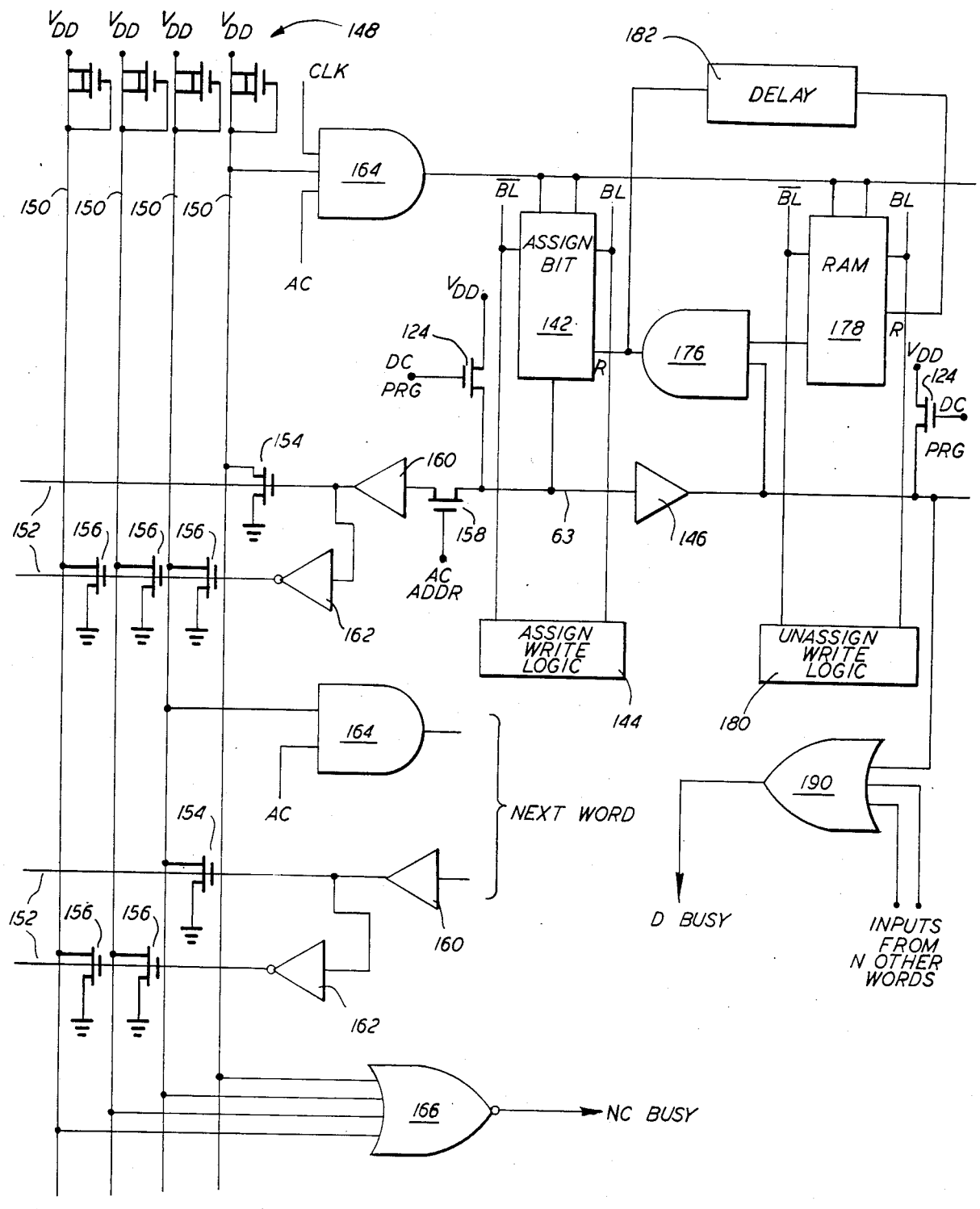
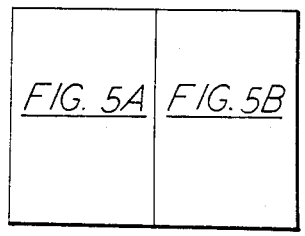
FIG. 5A
FIG. 5
ASSIGN PRIORITY LOGIC

4,656,626

APPARATUS AND METHOD FOR PROVIDING DYNAMICALLY ASSIGNED SWITCH PATHS

CROSS-REFERENCE TO RELATED APPLICATIONS

This application is related to the following U.S. patent applications: Ser. No. 682,030; Ser. No. 682,034; Ser. No. 682,035; Ser. No. 682,228; Ser. No. 682,038 all filed on even date herewith; and Ser. No. 722,894 filed on Apr. 12, 1985. All of the above applications are assigned to the assignee hereof.

BACKGROUND OF THE INVENTION

1. Field of the Invention

The present invention relates to an apparatus and method for establishing switch paths and more particularly to an apparatus wherein the paths are dynamically assigned to information sources and destinations.

2. Description of the Prior Art

In modern communication and data systems there is a need to rapidly and efficiently convey information between various points in the system. Such systems could be for communicating voice, data or any other type of information between a plurality of points which are often referred to as ports in certain arts. Most such systems require the use of a switch to selectively connect the various ports of a system. Modern systems must have the ability to dynamically establish and breakdown switch paths between a plurality of ports in response to system needs and commands.

In systems using PCM and TDM techniques the switching between ports may involve both spacial switching from port to port and time switching between channels of one or more ports. Thus, in a system having 8 ports each with 32 channels there are 256 sources and destinations that could require the dynamic assignment of switch paths.

SUMMARY OF THE INVENTION

Particular needs for such a dynamic switch are described in U.S. patent application Ser. No. 682,228, entitled "Apparatus For Establishing Communication Paths" and U.S. patent application Ser. No. 682,038, entitled "Communications System" both filed on even date herewith and incorporated herein by reference.

It is an object of the invention to provide a dynamic switch to satisfy the above needs.

It is a further object of the invention to provide an apparatus having a plurality of switch paths.

It is a further object of the invention to provide a method and apparatus for establishing paths between a plurality of sources and destinations.

It is a further object of the invention to provide a method and apparatus for dynamically establishing paths between a plurality of sources and destinations.

It is a further object of the invention to provide an apparatus and method for switching information between ports in a communication system.

It is a further object of the invention to provide an apparatus and method for switching information between any port and channel to another port and channel in a communication system, including the ability to provide a connection between two channels of the same port.

It is another object of the invention to dynamically establish switch paths between said ports and channels.

It is another object of the invention to dynamically establish switch paths in response to external commands.

The above objectives are achieved through the unique use of a CAM/RAM/CAM memory array to dynamically establish switch paths between points that are identified by addresses. The array is formed by two CAM portions and a RAM portion. The array forms memory words wherein each CAM portion of a word stores an address for accessing the RAM portion of a word. Each word establishes a switch path. The address of a point that is a source of information may be entered into one CAM called a source CAM while the address of the destination point of the information is entered into the other CAM called a destination CAM. Information arriving at a source point will be written into the RAM portion of the memory word identified by the source address. The information will thereafter be read out to the destination point identified by the destination address entered in the CAM word. The source and destination addresses in the CAM's may be dynamically assigned and unassigned to provide switch paths as required.

In its most basic form, the present invention provides a plurality of switch paths for connecting points identified by addresses which are entered into source and destination address CAM's. In its most powerful form, the present invention provides extremely flexibility by allowing the dynamic assignment and unassignment of switch paths between a plurality of points.

BRIEF DESCRIPTION OF THE DRAWINGS

FIGS. 5, 5a, and 5b are a detailed block diagrams of the present invention shown in its preferred embodiment.

DETAILED DESCRIPTION OF THE INVENTION

Figure 1:
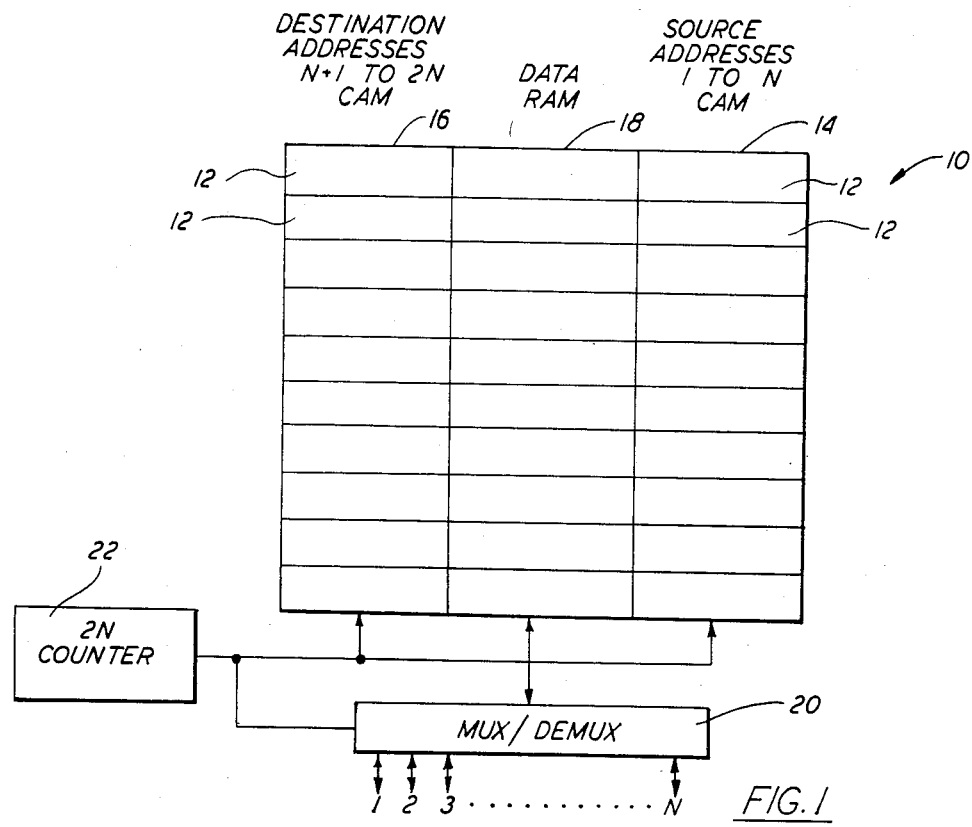
FIG. 1 is a functional block diagram of a basic CAM/RAM/CAM switch constructed in accordance with the present invention.

FIG. 1 is a block diagram of a CAM-RAM-CAM switch constructed in accordance with the present invention. The switch is designed to provide selected switch paths between ports 1 through N. The switch includes a CAM/RAM/CAM memory array 10 for storing a plurality of words 12 sufficient in number to accommodate all of the desired switch paths. The memory array includes a source address CAM portion 14, a destination address CAM portion 16 and a data RAM portion 18. The CAM portions should be provided with a sufficient number of storage bits so that the addresses of the ports may be stored therein. The data RAM should have a sufficient number of storage bits to store the volume of data that is to be switched each time a port is addressed. A multiplexer/demultiplexer 20 is connected between ports 1 through N and the data RAM 18. A counter, 22 counts modulo 2N and is used to drive the multiplexer/demultiplexer 20 and to provide addresses to the source CAM 14 and destination CAM 16.

In order to establish the selected switch paths, the addresses of the source ports are entered into the source CAM 14. The addresses assigned to ports 1 to N when the ports function as sources are the counter outputs 1 to N. The same ports are given destination addresses corresponding to counter outputs N+1 to 2N. The destination addresses are entered into the destination CAM 16 in the words containing the source address to which the destination is to be connected.

In operation as counter 22 drives the multiplexer 20 through ports 1 through N, the addresses corresponding to ports 1 to N are presented to both the destination and source CAM's. However, only addresses 1 to N are entered into the source CAM 14. A word having the present counter address stored in its source CAM 14 will be activated to enable the RAM portion 18 of the word to write any data that may be present at the addressed port and multiplexed to the RAM. Thus, as the multiplexer 20 is cycled through ports 1 to N, any data present on a port will be written into the word of the RAM having the port address in the source CAM portion. As the multiplexer is again cycled through ports 1 through N, the counter will present the destination addresses N+1 to 2N to CAM portion 16. As an address is presented to CAM portion 16, the word line in which the address appears will be activated so that the data in the RAM portion 18 for that word will be enabled and read out to the multiplexer/demultiplexer 20 for connection to the addressed port.

Thus, the present invention uniquely uses a CAM/RAM/CAM memory array as a switch for providing a plurality of selected switch paths. It is also contemplated that in the embodiment of FIG. 1 one source port could be connected to a plurality of destination ports. In addition a single port could be both the source and destination, thereby providing a loopback with a delay the extent of which depends upon the channels chosen.

Figure 2:
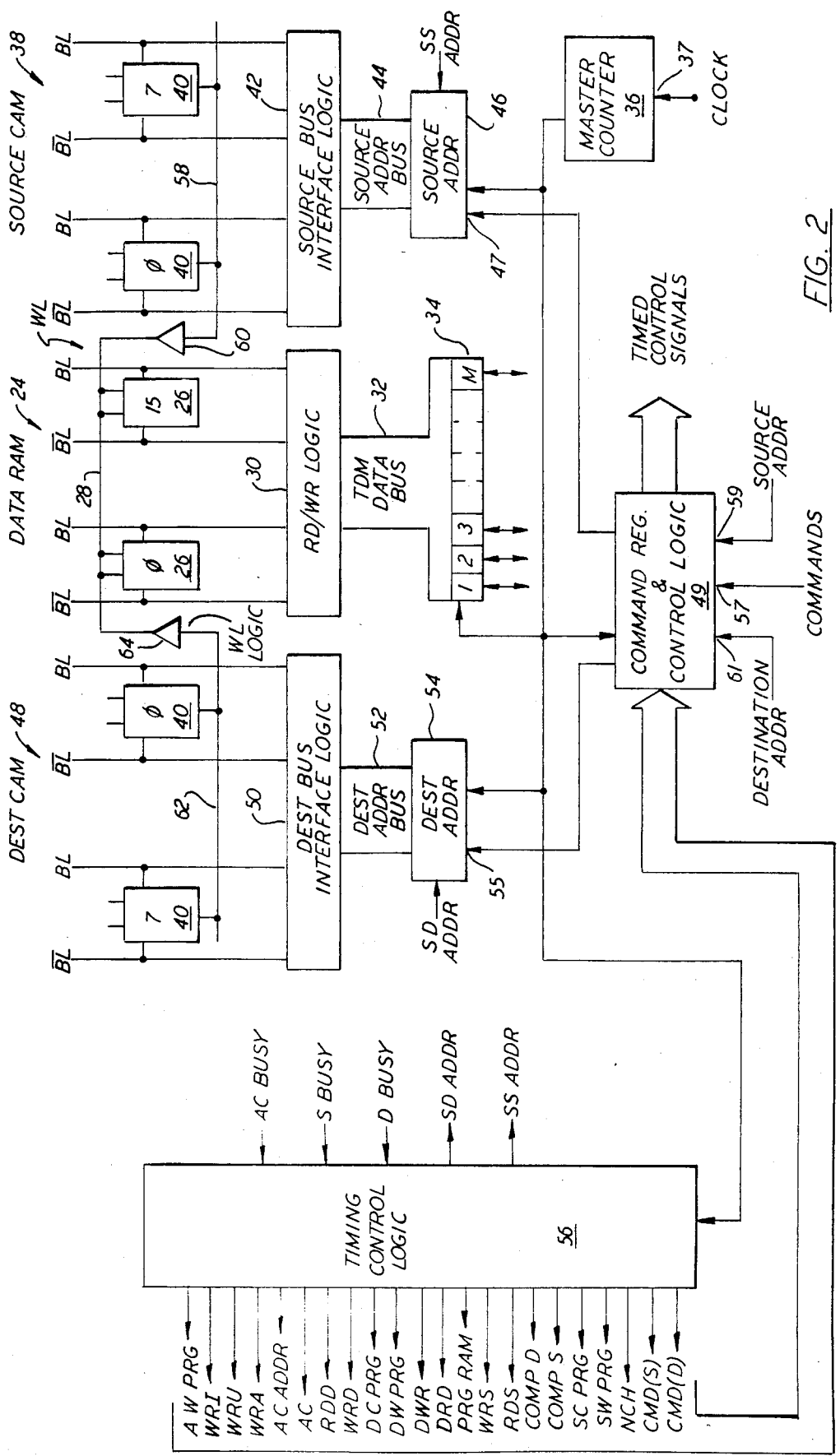
FIG. 2 is a more detailed block diagram of the present invention showing another embodiment that may be used in a communication system.

Referring to FIG. 2, there is shown a detailed block diagram of an implementation of the present invention. A CAM/RAM/CAM type memory array is provided having a plurality of words. The number of words must be sufficient to form all the necessary switch paths for the system with which it is to be used. When using the present invention in the co-pending application previously mention, the array may provide for 72 words. A source CAM portion 38 and a destination CAM portion 48 each have 8 bits while a data RAM portion 24 has 16 bits. FIG. 2 shows CAM/RAM/CAM cells for only one word with bit lines connected to logic circuitry. It should be understood that any number of words may be provided such as the 72 words previously mentioned.

Figure 3:
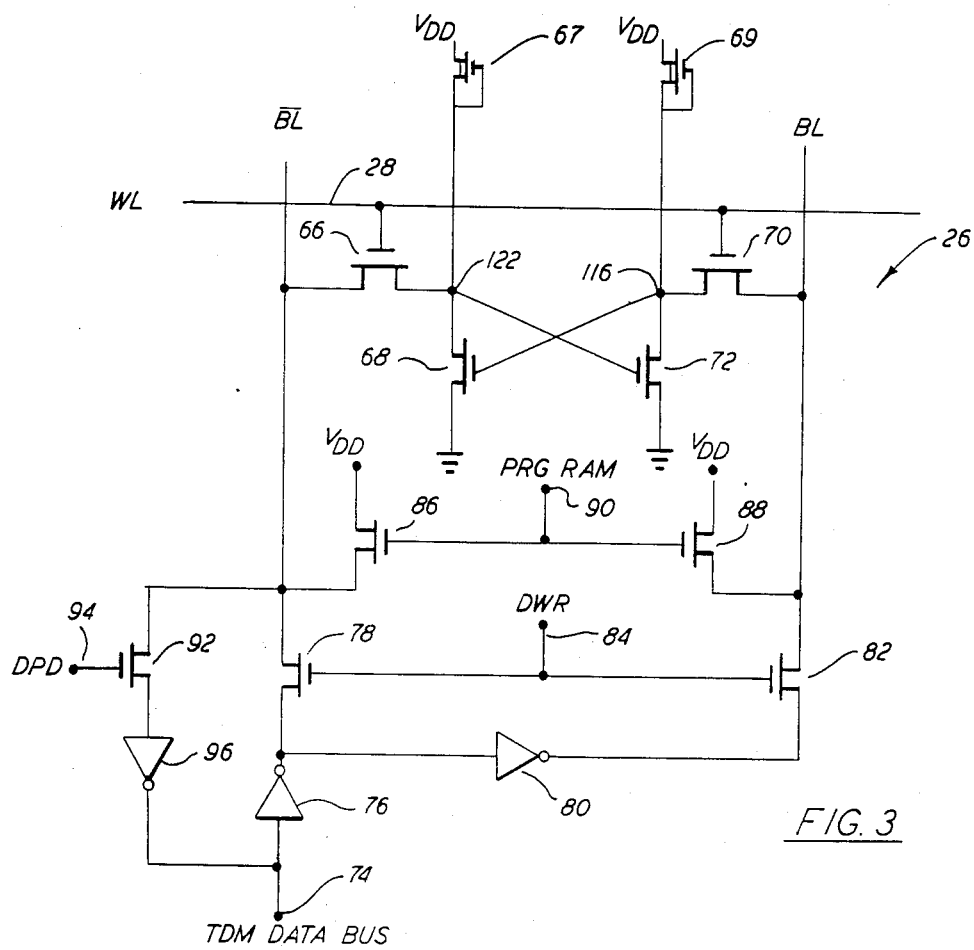
FIG. 3 is a schematic diagram of a RAM cell that may be used for storing one bit of RAM data.

The data RAM portion 24 includes a plurality of RAM cells 26 which may be constructed as shown in the schematic diagram of FIG. 3 and described subsequently. For each word in the array there is provided a word line 28 which is used for enabling all of the RAM cells 26 in a word. For each bit of the RAM memory there are provided bit lines BL and $\overline{BL}$. The bit lines extend across all words and are connected to all data RAM cells 26 corresponding to a particular bit position. The bit lines are connected to a read-write logic circuit 30, the details of which are also shown in FIG. 3 and described subsequently. The read-write logic circuit 30 is selectively connected to a plurality of sources and destinations represented by ports 34 through a parallel TDM data bus 32.

Ports 34 may take on many forms depending upon the particular system with which the invention is to be used. The ports could have serial or parallel inputs but should have a parallel output corresponding to the bits of the TDM data bus 32. Data received at a port 34 from the system, may be stored in a buffer as 16 parallel bits for transmission onto the lines of the TDM data bus. The ports 34 are individually strobed at an appropriate time by a signal from master counter 36. The master counter 36 is driven by a clock signal received at an input 37. The clock signal may be derived from a source in the using system. When strobed a port launches the data from its buffer onto the TDM data bus 32 in an appropriate time slot assigned to the port. The ports could be receiving PCM signals transmitted in frames each having a plurality of channels. In such an event several addresses would be assigned to each port, one address for each channel in the port.

Figure 4:
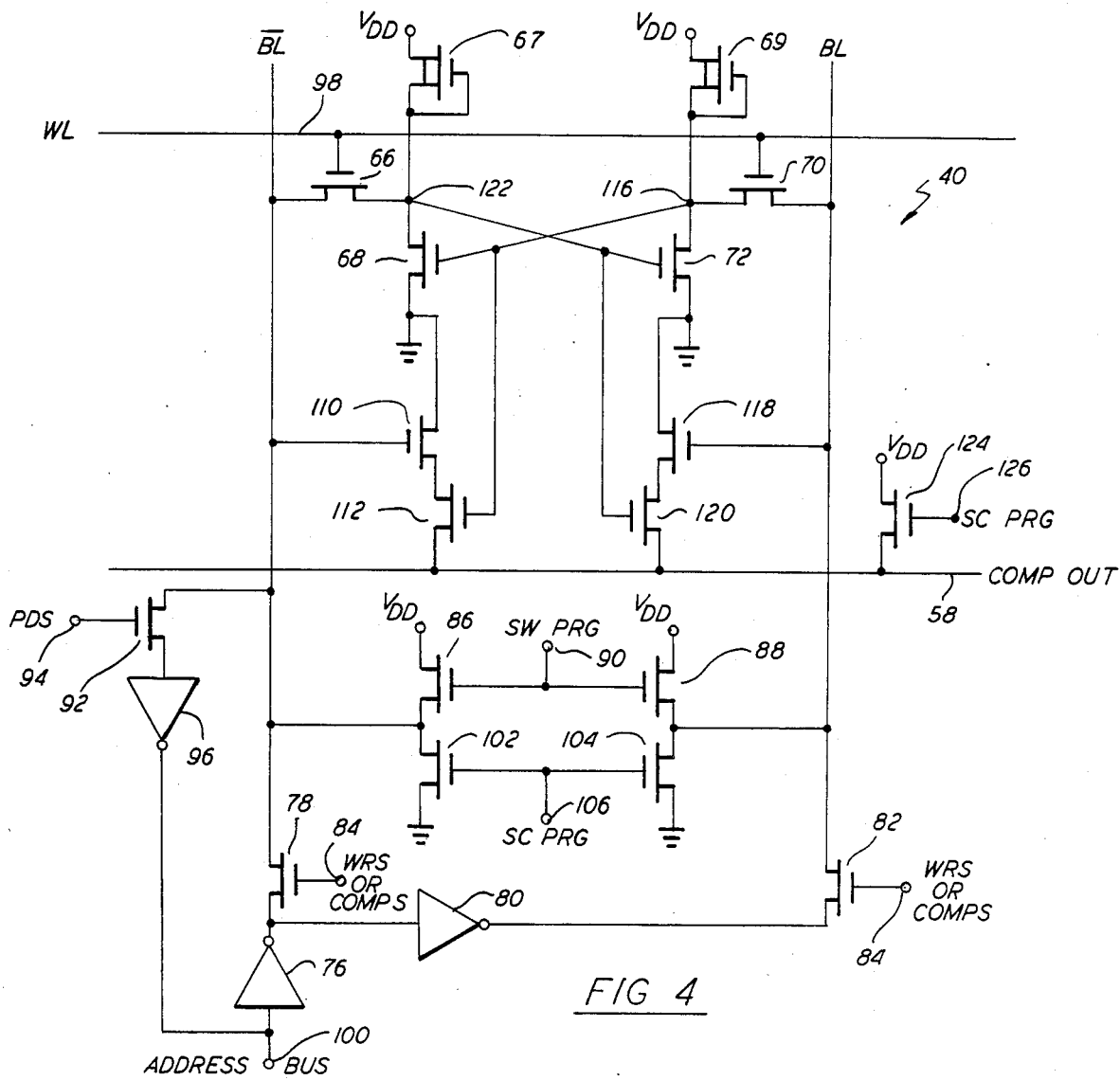
FIG. 4 is a schematic diagram of a CAM cell that may be used for storing and comparing one bit of CAM data.

The memory array includes a source CAM portion 38, including a plurality of CAM cells 40 constructed as shown in the schematic diagram of FIG. 4 and described subsequently. The source CAM portion 38 is provided with 8 cells for storing 8 bit source addresses for each word. Each CAM cell 40 is provided with bit lines BL and $\overline{BL}$ that extend across all words and are connected to a source bus interface logic circuit 42, which includes logic for each bit line pair, constructed as shown in FIG. 4.

The source bus interface logic circuit 42 is connected to a source address bus 44, which in turn is connected to a source address circuit 46. Source address circuit 46 may include a plurality of counters and registers for providing and storing source addresses. Source address circuit 46 includes an input 47 through which a source address may be entered from a using system through a command register and control logic circuit 49. The source address circuit 46 receives signals from the master counter 36 and a select source address, S S ADDR, signal from a timing control logic circuit 56. In response to these signals the source address circuit 46 launches a source address from a particular counter or register onto the source address bus 44 during an appropriate time slot. The counters in circuit 46 could be associated with the various ports to provide a dynamically changing address corresponding to the particular channel that may be on the port at a particular time.

A destination CAM portion 48 is formed of 8 CAM cells 40 for each word for storing 8 destination address bits per word. CAM cells 40 are constructed as shown in FIG. 4. The CAM cells 40 are connected to a destination bus interface logic circuit 50 by pairs of bit lines BL and $\overline{BL}$. Logic circuit 50 includes logic circuitry as shown in FIG. 4 for each CAM cell. The destination bus interface logic circuit 50 is connected to a destination address bus 52 which in turn is connected to a destination address circuit 54.

Destination address circuit 54 may include a plurality of counters and registers for providing and storing destination addresses. Destination address circuit 54 includes an input 55 through which a destination address may be entered from a using system through the command register and control logic circuit 49. The destination address circuit 54 receives signals from the master counter 36 and a select destination address, S D ADDR, signal from the timing control logic circuit 56. In response to these signals the destination address circuit 54 launches a destination address from a particular counter or register over the destination address bus 52. The counters may provide a dynamically changing address corresponding to channels being connected to the ports.

The master counter 36 is also connected to a timing control logic circuit 56, which provides timed control signals at appropriate times for proper circuit operation. The timed control signals are provided to the command register and control logic circuit 49 where they are gated in accordance with commands received by circuit 49. The timing of the various control signals from circuit 49 is shown in the timing diagrams of FIGS. 7 to 9. Circuit 49 receives commands at an input 57 from the using system. Circuit 49 is adapted to receive source addresses from the using system at an input 59 and to receive destination addresses from the using system at an input 61. A command register and control logic circuit that may be used in the present invention is disclosed in U.S. patent application Ser. No. 682,228 entitled Switch Controller and filed on even date herewith.

Operation of the switch shown in FIG. 2 will be described assuming a number of source and destination addresses have already been entered into the source and destination CAM's for the sources and destinations provided by ports 34 that are to be connected by the switch. When an address appears on the source address bus 44 from the source address circuit 46 all of the CAM cells 40 in the entire source CAM portion 38 will perform a compare function as described subsequently. If each bit of a stored address for a word matches each bit on the source address bus a logic level 1 output will be provided on a compare line 58. If any one particular bit does not compare, its CAM cell will provide a logic level 0 output driving the entire compare line 58 to logic level 0.

The compare line 58 is connected to the data RAM word line 28 through a buffer 60. Thus, if each bit on the source address bus compares with a stored word address in the source CAM portion 38 a logic level 1 will be provided to the word line 28 thereby enabling each of the data RAM cells 26 during a time slot following the strobing of the source address circuit by the master counter 36. During this subsequent time slot the master counter 36 strobes the appropriate port 34 corresponding to the address strobed from the source address circuit causing the port to launch the data contained therein on to data bus 32 so that the parallel data bits may be written into the data RAM cells 26 of the enabled word.

In a similar manner, the master counter 36 strobes the destination address circuit 54 during an appropriate time slot just prior to strobing the addressed destination port 34 so that the destination address bits are applied to the bit lines of the destination CAM portion 48. If the address presented on the destination address bus 52 is stored in a word of the destination CAM portion 48, each bit will compare and a logic level 1 output will be provided on a compare line 62 which provides a logic level 1 to word line 28 through a bufer 64, thereby enabling the RAM cells 26 of the addressed word. The data contained in the enabled RAM cells 26 may be read and placed on the TDM data bus for communication to the strobed port 34 corresponding to the address provided on the destination address bus 52.

Referring to FIG. 3 there is shown a schematic diagram of a standard RAM cell 26 as used in the data RAM portion 24 of the memory array. Essentially, the RAM 26 cell includes a memory portion comprising transistors 66, 68, 70 and 72 interconnected in a standard manner. RAM 26 comprising transistors 66, 68, 70 and 72 form a dynamic RAM and therefore would require a refresh means. Accordingly, transistors 67 and 69 are provided and are connected in a standard manner to make the RAM static thereby eliminating the need for a refresh means. Transistors 66 and 70 are connected to a word line 28 for the purpose of enabling the RAM cell and connecting it, respectively, to the bit lines BL and $\overline{BL}$. The bit lines extend across all of the words of the memory array and connect all of the RAM cells 26 associated with a particular bit of the memory words. As shown in FIG. 2 the bit lines are connected to a read/write logic circuit 30 which includes the logic circuitry shown in FIG. 3 for each bit line pair. The logic circuitry controls the writing and reading to and from the RAM cells connected to a bit line pair.

The read/write logic for each bit line pair includes a terminal 74 for connection to a line in the parallel TDM data bus for receiving data from the bus and delivering stored data to the bus. The terminal 74 is connected to an inverter 76 which has an output connected to bit line $\overline{BL}$ through a transistor 78. The output of inverter 76 is also connected to another inverter 80 which has an output connected through a transistor 82 to bit line BL. An input 84 is adapted to receive a data write signal DWR which is connected to transistors 78 and 82 to allow data from the TDM data bus to flow to the bit lines $\overline{BL}$ and BL. Prior to initiating a write operation by providing the signal DWR to input 84 the bit lines are conditioned by a precharge through transistors 86 and 88 which are responsive to a precharge RAM signal PRG RAM provided on terminal 90. The precharge on terminal 90 causes transistors 86 and 88 to turn on thereby providing a $V_{DD}$ signal to the bit lines forcing them to a logic level 1. After the precharge operation the data write command DWR is provided to input 84 so that the data on the TDM bus may be written onto the bit lines. The data on the bit lines may be stored in the RAM cell 26 by driving the word line 28 with a logic level 1 causing transistors 66 and 70 to turn on and allowing the cell to write the data to the RAM cell. The data on bit lines BL and $\overline{BL}$ will be stored at nodes 116 and 122 respectively.

Figure 7:
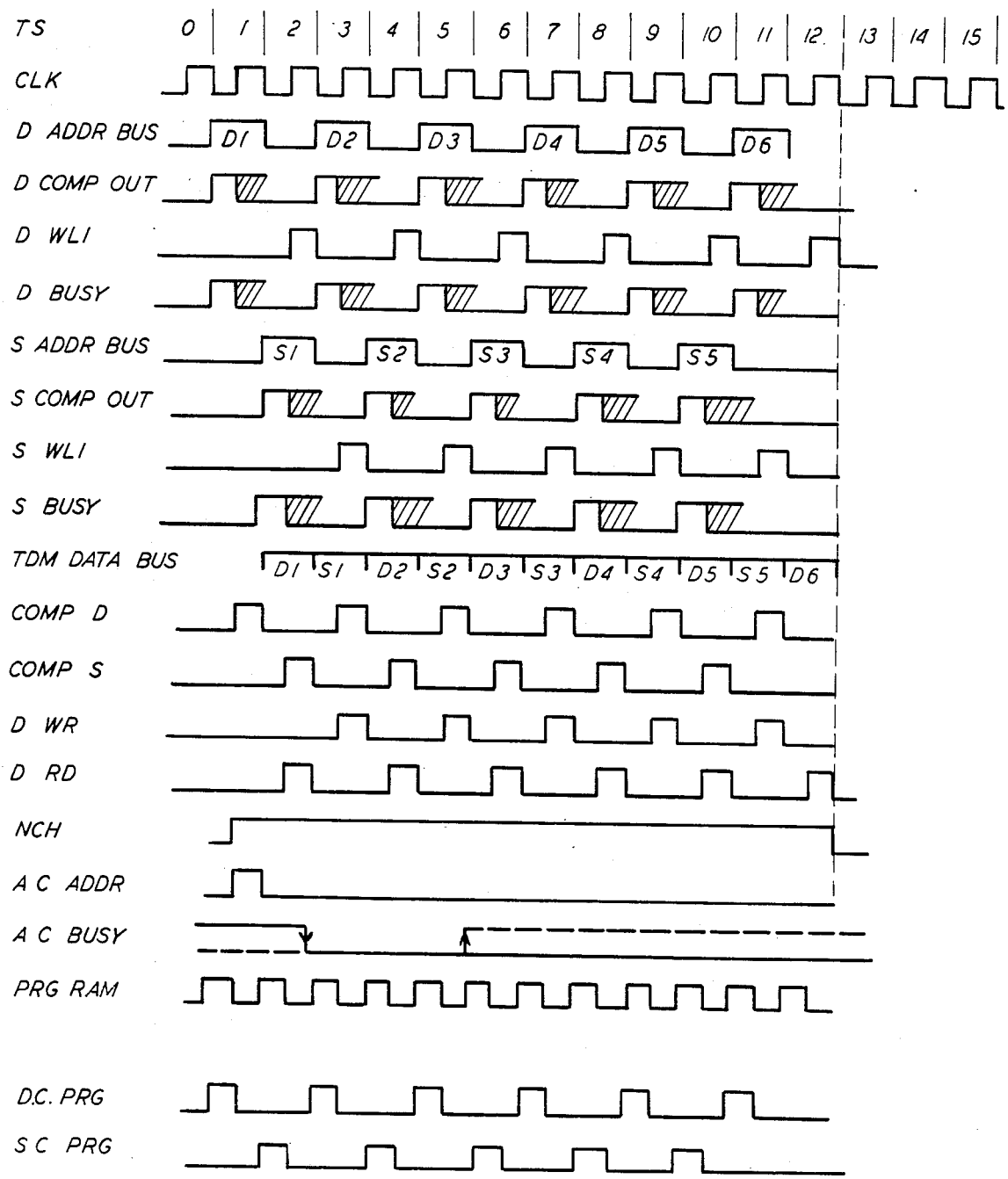
FIG. 7 through 9 are signal timing charts for various modes of operation of the present invention.

In order to read the data stored in the RAM cell the read/write logic circuit 30 includes for each bit line pair a transistor 92 connected to bit line $\overline{BL}$, said transistor being responsive to a data read signal DRD provided on an input terminal 94. Transistor 92 connects the bit line $\overline{BL}$ to an inverter 96 which has an output connected to terminal 74 for providing readout data thereto. In order to read the data stored in the RAM cell the BL and $\overline{BL}$ bit lines are precharged via transistors 86 and 88 and the word line 28 is driven to a logic level 1 so that transistor 66 and 70 conduct providing the data stored at nodes 116 and 122 to the bit lines and a data read signal DRD is provided to an input 94 to turn on transistor 92 thereby providing the signal contained on bit line $\overline{BL}$ to the terminal 74 through inverter 96. The timing of the signals is shown in FIG. 7.

Referring to FIG. 4 there is shown the circuitry for a standard CAM cell 40 which comprises a RAM memory portion similar to that shown in FIG. 3, a compare portion and a bus interface logic portion somewhat similar to the logic shown in FIG. 3 but with the addition of a bit line discharge circuit. The components of FIG. 4 which corresponds to those of FIG. 3 and serve the same function are given the same numerical indicia. The CAM cell of FIG. 4 will be described as a source CAM cell. A destination CAM cell will be similar but will receive destination CAM control signals with different timing as shown in FIG. 7.

The RAM memory portion comprises transistors 66, 67, 70 and 72 with transistors 66 and 70 being connected to a word line 98 which may or may not be the same word line as word line 28 shown in FIG. 3 depending upon system with which the invention is used. The logic circuitry connected to the bit lines includes a terminal 100 connected to a line of the parallel source or destination address bus. The inverters 76 and 80 perform the same function as those shown in FIG. 3 as do the transistors 78 and 82. Input 84 is shown as two separate inputs 84 for purposes of convenience and receive a source write signal WRS or a compare source signal COMP S when a compare opeation is to be performed. Transistors 86 and 88 and the precharge input 90 perform the same function as in FIG. 3 and are used to condition the bit lines by precharging them to a logic level 1 when receiving an S W PRG signal prior to a read or write operation. The logic circuitry in addition includes transistors 102 and 104 both responsive to a signal S C PRG received on an input 106 prior to a compare operation. When a write operation is to take place the bit lines are precharged to a logic level 1 whereas when a compare operation is to take place the bit lines are discharged to a logic level 0 by connecting them through transistors 102 and 104 to ground potential.

Reading from the RAM cell is essentially identical to that of FIG. 3 and is made possible by transistor 92, input 94 and inverter 96 which has an output connected to terminal 100 from which the stored data may be read.

The compare circuitry comprises serially connected transistors 110 and 112 connected between ground and a compare line 58. Transistor 110 is responsive to the signal contained on bit line $\overline{BL}$ while transistor 112 is responsive to the signal stored at a node 116 of the RAM cell. Transistors 118 and 120 are serially connected between ground and the compare line 58 with transistor 118 being responsive to the signal contained on bit line BL while transistor 120 is responsive to the signal stored at node 122 of the RAM cell. A transistor 124 is connected between $V_{DD}$ and the compare line 58 and is responsive to a source compare precharge signal S C PRG received at an input 126 for precharging the compare line 58 to logic level 1 prior to a compare operation. Transistor 124 is not truly a part of a CAM cell and is shown in FIG. 4 merely from convenience of explanation. One precharge transistor such as 124 is required for each compare line 58 and 62 shown in FIG. 2.

The purpose of the compare circuitry is to perform a compare operation between a bit provided to terminal 100 by the source address bus and the bits stored in the RAM portion of the CAM cells associated with the particular bit line. Prior to performing a compare operation the bit lines BL and $\overline{BL}$ are discharged to a logic level 0 by the signal S C PRG at input 106. Likewise, the compare line 58 is precharged to a logic level 1 by the signal S C PRG. If the CAM cell shown in FIG. 4 is storing a logic level 1, node 116 will be at a 1 level while node 122 will be at a 0 level. Upon receipt of a compare signal COMP S at terminals 84, the signal at terminal 100 which will be assumed to be logic level 1, will be provided to bit line BL as a logic level 1 and to bit line $\overline{BL}$ as logic level 0. At this time word line 98 is unaffected and will be at a logic level 0 so that transistors 66 and 70 remain off. Transistor 118 will be turned on by the logic level 1 on bit line BL while transistor 120 will be turned off by the logic level 0 at node 122. Thus, the serial connection of transistors 118 and 120 will appear as an open circuit. Transistor 110 will be turned off by the logic level 0 on bit line $\overline{BL}$ while transistor 112 will be turned on by the logic level 1 at node 116. However, due to transistor 110 being turned off the serial connection of 110 and 112 will appear as an open leaving the compare line 58 charged at the precharged logic level 1 indicating that there is a comparison between the signal on the source address bus and the stored data in the CAM cell. If the source address bus provides a logic level 0 at terminal 100 the bit line BL will be charged to a logic level 0 while bit line $\overline{BL}$ will be at a logic level 1. Accordingly, transistor 110 will be turned on by the logic level 1 on bit line $\overline{BL}$ and transistor 112 will be turned on by the logic level 1 stored at node 116 of the RAM cell thereby connecting the compare line 58 with ground and providing a logic level 0 on the compare output. Both transistors 118 and 120 will remain off due to the logic level 0 appearing on bit line BL and at node 122. Thus, a logic level 0 on the compare output line 58 will indicate no comparison between the source address bus and the stored address bit in the CAM cell.

In FIG. 2 it is shown how the compare outputs of the various CAM cells are connected along the compare outlines 58 and 62. It is to be understood that any CAM cell providing a logic level 0 output on the compare line will drive the line to logic level 0 since it will function to discharge the precharged logic level 1 to ground.

Figure 5B:
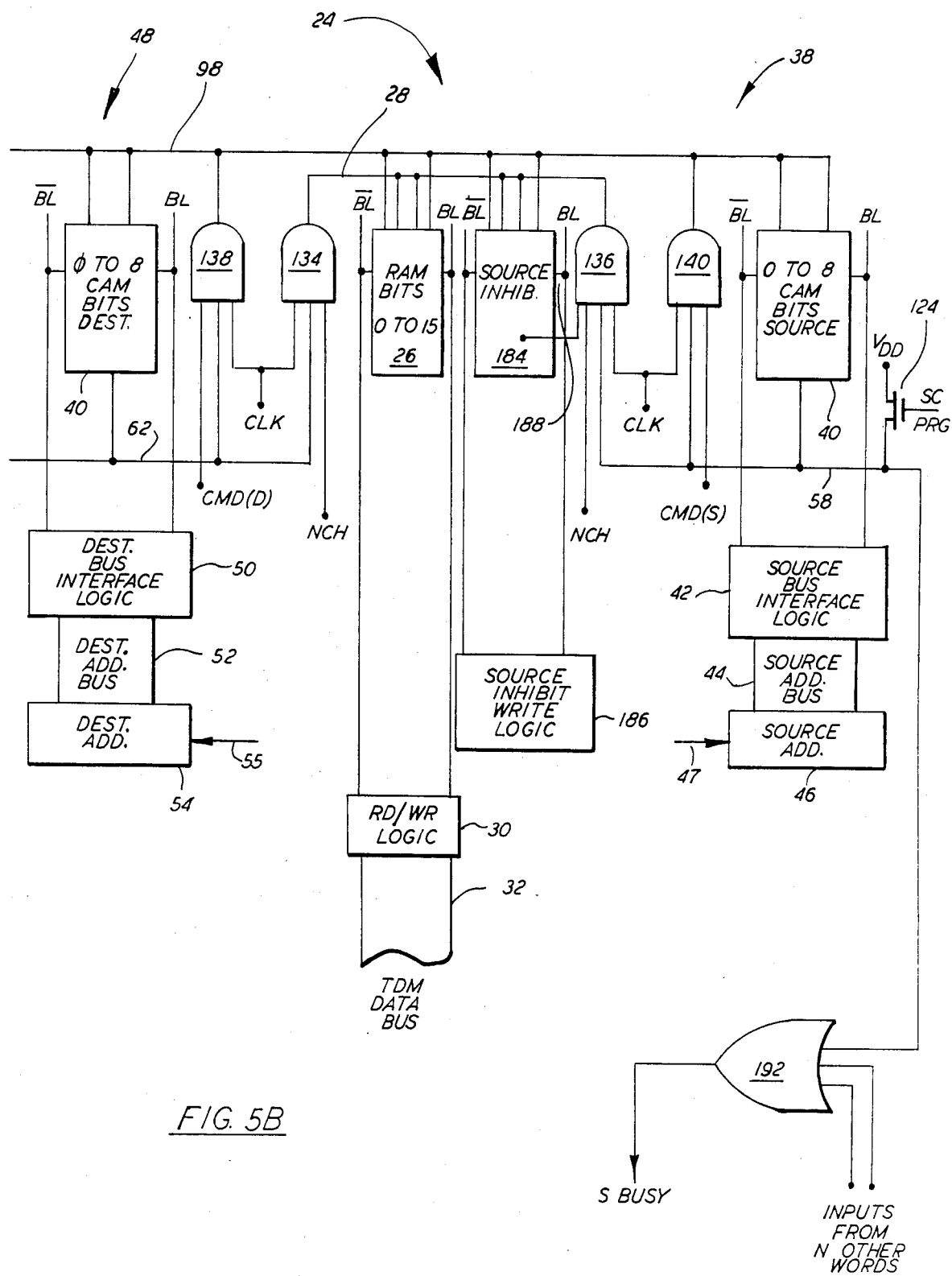
Figure 9:
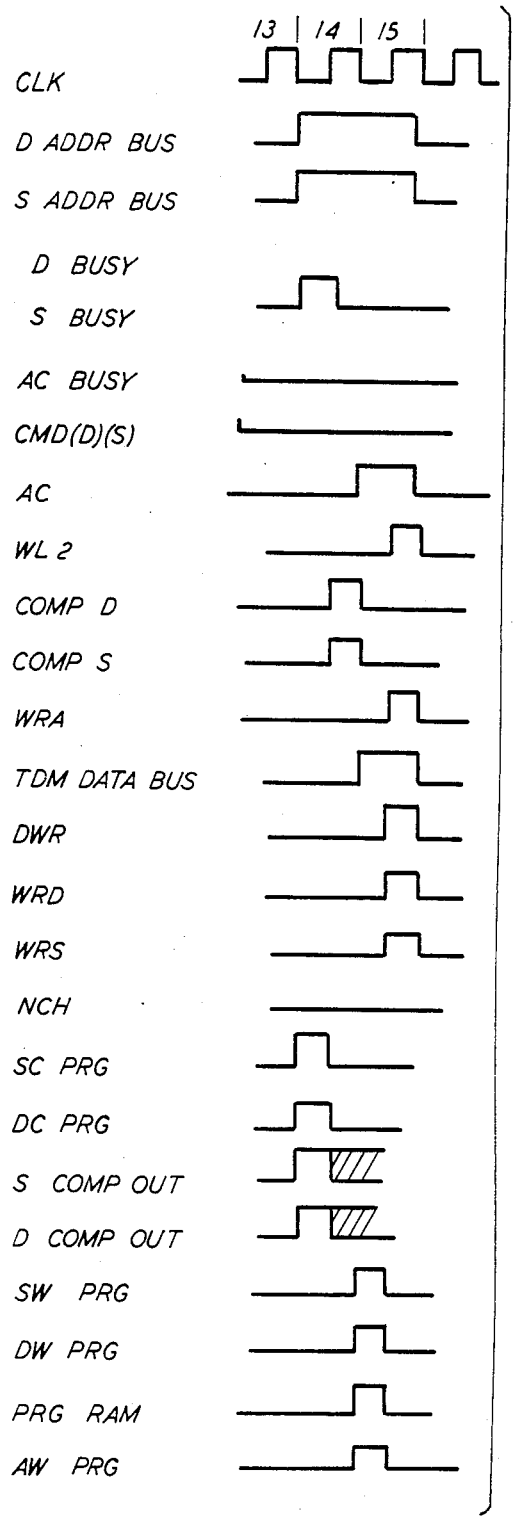

Referring to FIG. 5, there is shown a detailed block diagram of a preferred embodiment of the present invention. The circuit of FIG. 5 includes the CAM/RAM/CAM memory array as previously described in regard to FIG. 2. There are a number of RAM cells 26, contained in RAM portion 24, for storing data bits for each word. The number of bits being determined by the requirements of the system using the invention. In the described embodiment 16 bits will be used. The RAM cells 26 are connected through pairs of bit lines to the read/write logic 30 and thereafter to the TDM data bus 32 as previously described. There are two CAM portions. A source CAM portion 38 including CAM cells for source addresses and a destination CAM portion 48 including CAM cells for destination addresses. The number of address bits depends upon the number bits necessary for identifying the addresses. In the described embodiment 8 bits are provided for storing the source and destination addresses. The CAM cells are connected through pairs of bit lines to the bus interface logic circuits 42 and 50 which in turn receive addresses from the source and destination address buses 44 and 52 which are connected to the source and destination address circuits 46 and 54. Transistors 124 are connected as shown in FIG. 4 to precharge the compare lines 58 and 62 at the proper times prior to a compare operation as shown in FIG. 9.

The first word line 28 is connected only to the RAM cells and is responsive to the compare output lines 58 and 62 which are controlled respectively by the source CAM cells and the destination CAM cells in response to a compare operation. Thus, there is no way to enable any cells for a read or write except by a compare operation and that only enables the RAM cells.

Figure 6:
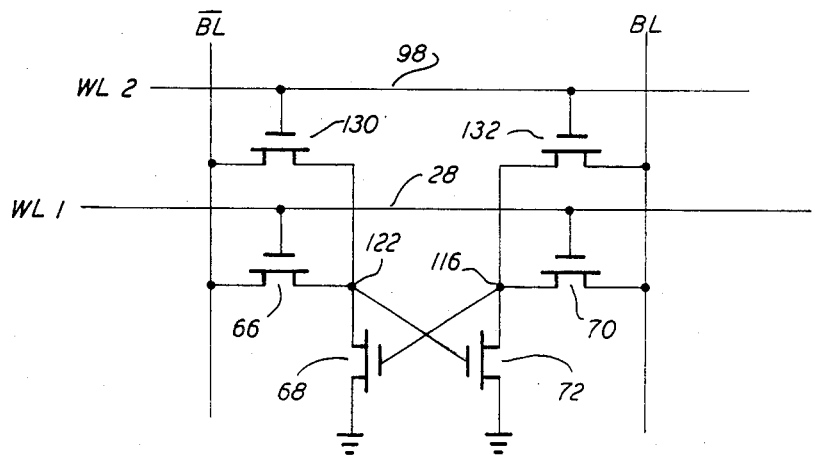
FIG. 6 is a schematic diagram of a modification of a RAM cell connected to two word lines.

It may be desirable to read or write from or to any portion of the memory array; therefore, a second word line 98 has been provided for connection to all of the CAM and RAM cells. The RAM cells must be responsive to both word line 28 and word line 98 and have therefore been modified as shown in FIG. 6 to include two additional transistors 130 and 132 both being responsive to the logic level on word line 98. Transistor 130 is connected between the bit line $\overline{BL}$ and node 122 of the RAM cell while transistor 132 is connected between the bit line BL and node 116 of the RAM cell. Thus, the RAM cells may be enabled for a read or write operation by providing a logic level 1 signal on either word line 28 or word line 98.

Referring again to FIG. 5, AND gate 134 is disposed between compare output line 62 and word line 28 while AND gate 136 is disposed between compare output line 58 and word line 28. An input signal NCH is provided to inputs of both AND gates 134 and 136. The signal NCH is at a logic level 1 during periods when compare operations are to take place between the addresses on the address buses and the stored addresses in the CAM's so that a compare output logic level 1 signal may be passed on to the word line 28 to enable the RAM cells and allow them to read or write data to or from the data bus 32.

In a similar manner, an AND gate 138 is connected between compare output line 62 and word line 98 while an AND gate 140 is disposed between compare output line 58 and word line 98. A source command signal CMD(S) is provided to the input of gate 140 while a destination command signal CMD(D) is provided to an input of gate 138.

A clock signal CLK is provided to inputs of gates 134, 136, 138 and 140 to control when the gates are enabled.

Thus, when it is desired to read or write from or to any portion of a word without affecting a transfer of data from a source to destination, word line 28 is inhibited by a logic level 0 NCH signal which effectively blocks the AND gates 134 and 136. Any desired word may be addressed through either the source CAM or destination CAM portions by placing the address of the word on the source or destination address bus which address is applied to the bit lines of the source or destination CAM portion. If the address compares to an address stored in the CAM, then the source or destination compare output line 58 or 62 will provide a logic level 1 signal to AND gate 140 or 138 which gate will be turned on by applying a CMD(S) or CMD(D) signal to the appropriate gate so that word line 98 is driven to a logic level 1 thereby enabling all cells, both CAM and RAM, of the addressed word. A read or write of data from or to any RAMs and/or CAMs in the word can then take place by applying an appropriate read or write control signal to the logic circuit connected to the bit lines associated with RAMs and/or CAMs. The address for this selective read or write operation comes from the source or destination address circuit and may be generated by a counter contained therein or stored in a register. Addresses contained in registers may have been generated during a prior read operation or may have been received by inputs 47 or 55 from an outside source.

Thus, it has been described how data may be written into and read from the data RAM portion 24 to effect a switching of data between source and destination addresses. It has also been described how addresses may be written to and read from the source and destination CAM portions 38 and 48. It may be desirable that a means be provided to write new data to the highest priority unused memory word contained in the memory array. Such a means is provided through the use of an assign bit line including a plurality of assign bit cells 142, one for each word, which are constructed in a manner similar to that of the CAM cells 40 shown in FIG. 4 with the exception that a different assign write logic 144 is used and a reset feature is provided. A transistor 124 is connected to a compare output line 63 of the assign bit cell 142 to precharge the compare output line 63 in response to a D C PRG signal. The circuitry of the assign bit cell 142 and the assign write logic will be described subsequently.

An assign bit cell 142 stores a logic level 1 when its word is being used or is assigned. The assign bit cells 142 are compared to a logic level 1 at the same time that the cells 40 of the destination CAM portion 48 are being compared. If the assign bit cell contains a logic level 0 then a no compare will take place and the output compare line 63 will be at logic level 0 and will drive line 62 to logic level 0 through buffer 146, thereby preventing the enablement of word line 28 or 98 and the RAM cells connected thereto. Thus, the assign bit compare output line 63 indicates that the word is not being used despite the fact that a previously used destination address may still be stored in the CAM cells of destination CAM portion 48. The no compare 0 level logic signal at the compare output line 63 of assign bit 142 is also used in conjunction with an assign priority logic circuit 148, which provides an output indicating the highest priority available word. The assign priority logic circuit may be constructed in different ways, either as shown in FIG. 5 or as a string of gates which provides an indication that only one word of the memory, the highest priority word, is empty or available for use. All lower priority words, even if empty, will be inhibited from use until all higher priority words become used. The assign priority logic circuit 148 is essentially an array of columns 150 and rows 152 with one column and one row for each word of the memory array. Each column 150 is connected to $V_{DD}$ for maintaining the column at a logic level 1. Each row comprises one transistor 154 connected between the column associated with the row and ground and a plurality of transistors 156 connected between all other columns corresponding to lower priority words and ground. The compare output line 63 of the assign bit cell 142 is connected through a transistor 158 to gate the compare output in response to an assign address signal AC ADDR to a buffer 160 which drives transistor 154. The output of buffer 160 is also connected to an inverter 162 which drives transistors 156. An AND gate 164 is provided for each word and has one input connected to the column for its associated word, a second input connected to a command signal AC and a third input connected to CLK. The output of AND gate 164 is connected to word line 98.

If assign bit 142 provides a compare output at a 0 logic level indicating that the word line is not presently assigned, transistor 158 will conduct the logic level 0 to the buffer 160 and transistor 154 will remain in an off condition allowing the column representing the first or highest priority word to remain at a 1 logic level. The logic level 1 on the column is applied to AND gate 164 for the highest priority word and the AND gate in response to an AC command and CLK will provide a logic level 1 to word line 98 thereby enabling the entire word line making it possible to write in new data. The logic level 0 at the output of buffer 160 is provided to inverter 162 which provides a logic level 1 signal to transistors 156 causing them to turn on and drive the columns associated with all lower priority words to a 0 logic level indicating their unavailability.

If the assign bit 142 were to provide a logic level 1 compare signal indicating the unavailability of the word, this logic level 1 would be provided to transistor 154 through transistor 158 and buffer 160 causing transistor 154 to turn on and the column 150 associated with the particular word would be driven to logic level 0 thereby inhibiting gate 164 so that upon the receipt of an AC command and CLK, word line 98 for the particular word would not be enabled. The logic level 1 signal would also be provided to the input of inverter 162 which at its output provides a logic level 0 signal which would not turn on transistors 156 and the lower priority columns would remain at logic level 1 to be further acted upon by the assign bit cell compare output signal for the lower priority words.

The columns 150 are connected to inputs of a NOR gate 166 such that if any of the columns of the assign priority logic remain at a 1 level indicating their availability, the NOR gate will provide a 0 level output on a signal called AC BUSY. Thus, the AC BUSY signal will only be at a 1 level if all words in the memory array are presently being used.

Thus, if the AC BUSY signal is at a logic level 0, it is known that a memory array word is available and an AC command may be provided to gates 164 so that the word line 98 of the highest priority available word will be enabled allowing data to be written into the CAM's, RAM's and assign bit 142 of the particular word. At this time, the assign bit is written to a logic 1 thereby indicating that the word is now used.

The modified CAM cell used for the assign bit 142 includes the RAM memory portion and the compare portion similar to that shown in FIG. 4 and operates in an identical manner. The assign write logic portion 144 includes the bit line precharge circuit responsive to an assign write precharge signal A W PRG and a bit line discharge circuit responsive to D C PRG signal. Transistors 76, 80 and 96 of FIG. 4 are not used nor is transistor 92. Transistor 78 connects $\overline{BL}$ to ground while transistor 82 connects bit line BL to $V_{DD}$. Transistors 78 and 82 are responsive to WRA and COMP D signals. The assign CAM cell includes a reset feature provided by a transistor connecting $V_{DD}$ to node 122 and a transistor connecting node 116 to ground. Both transistors are responsive to a reset signal which is provided by an AND gate 176 shown in FIG. 5 and associated with an unassigning means.

Means must be provided to unassign a word in the memory array and this could most easily be accomplished by writing a logic level 0 to the assign bit 142 which would require a minor modification of assign write logic 144. However, it is preferable in this application to prevent a word from becoming unassigned until the destination CAM portion 48 is compared and any word in the data RAM is allowed to be read. This feature is provided by adding another RAM bit line to the array with a RAM cell 178 for each word. This bit is known as the unassign bit.

The unassign bit cell is constructed similar to that of the RAM cell of FIG. 3 except that inverters 76, 80 and 96 are eliminated as is transistor 92. Transistor 78 is connected to ground and transistor 82 is connected to $V_{DD}$. Transistors 78 and 82 are responsive to a WR VA signal. Terminal 90 receives a PRG RAM signal for precharging the bit lines prior to a read or write operation. The RAM cell includes a reset feature provided by a transistor connecting $V_{DD}$ to mode 122 and a transistor connecting mode 116 to ground. Both transistors are responsive to a reset signal.

The RAM cell 178 includes an additional output derived from node 116 which is provided to an input of gate 176 shown in FIG. 5. Gate 176 has a second input connected to the compare output line 62 of the destination CAM portion 48.

To unassign a word the unassign bit is written to a logic level 1 by the unassigned write logic circuitry 180. After writing a logic level 1 to RAM 178, a logic level 1 signal from node 116 of the unassign RAM 178 is presented to gate 176. The next time the destination CAM portion 48 does a compare operation, a logic level 1 signal from the destination compare output line 62 allows a read out of any data in RAM portion 24 and also presents a logic level 1 to gate 176. Gate 176 provides a logic level 1 to the assign bit 142 thereby resetting the assign bit 142 to logic level 0 indicating the unassigned condition of the word. The output of gate 176 is also provided to the reset input of RAM 178 through a delay 182 to thereby reset the unassign RAM 178 to a logic level 0.

A means should be provided to unassign the source CAM portion of an unassigned word to prevent a S COMP OUT logic level 1 signal on line 58. This could be accomplished in several ways. An unassign bit similar to 142 could be added on the source side and written to logic level 0 when it is to be unassigned. However, on the source side there is no need to provide an output to an assign priority logic since this was taken care of on the destination side. Therefore, an inexpensive way of unassigning the source side and preventing a S COMP OUT logic level 1 is to write an unused source address to the unassigned word.

In certain circumstances, it may be that data is written into the RAM portion 24 while writing source and destination addresses. Thus, it may be desirable to prevent the first word received on the data bus 32 by way of a source CAM compare operation from writing to the data RAM portion 24 until after the first destination CAM compare operation and the resulting read of the data RAM is completed. This source inhibit may be accomplished by adding another RAM bit line with each word having a source inhibit RAM cell 184 and source inhibit write logic 186 for writing to the bit lines. The source inhibit RAM cell 184 is a standard RAM cell constructed to be enabled by either of two word lines as shown in FIG. 6. Each cell additionally includes an output 188 from node 122 of the RAM cell. Output 188 is connected as an input to AND gate 136. The source inhibit write logic 186 is similar to the unassign write logic 180 associated with RAM 178 with the write command signal being WRI.

When a memory array word is first assigned via the assign bit 142, the source inhibit bit 184 is written to a logic level 1. Thus, node 122 of the source inhibit cell 184 is at a logic level 0 which is provided at output 188 and blocks gate 136 preventing a word line from being generated via a source CAM compare. The source CAM compare line 58 will be blocked by gate 136 until a logic level 1 is removed from the source inhibit cell 184 as the result of the destination CAM portion doing a compare operation and generating a compare output logic level 1 and enabling word line 28. The source inhibit cell 184 can be written to a 0 logic level when word line 28 is enabled as previously described. Writing of the source inhibit cell 184 will remove the logic level 0 from output 188 and will thereby enable gate 136 allowing source CAM compare outputs to generate a logic level 1 on word line 28.

Another possible requirement of the invention may be to prevent the source CAM portion or the destination CAM portion from containing the same word in more than one location. The same word in more than one location would cause two different word lines to be generated and if a read were taking place the data would be mutilated with more than one word addressed. In the event of a write operation more than one word could be written without a problem but this may not always be desirable. The solution to this requirement is to detect the presence of a word in the source or destination CAM portions before initiating a write operation on a new word to be entered. This is accomplished by applying the new word including source and destination addresses to the CAM bit lines and simultaneously looking for a compare output on either lines 58 or 62 while inhibiting the word lines via logic level signals on AC, NCH and CMD. If a compare output provides a logic level 1 there is an indication that the same data is present in a word and the write operation may be aborted. The presence of a compare output logic level 1 on any compare output line is sensed by providing OR gates 190 and 192 having inputs connected to the compare output lines 62 and 58 respectively for each word. OR gate 190 will provide a logic level 1 output called D-BUSY if any compare output line 62 is at a logical level 1. Likewise, OR gate 192 will provide a logic level 1 at the output called S-BUSY if any source compare output line 58 has a logic level 1 thereon. Thus, the presence of a logic level 1 on either the D-BUSY or S-BUSY output may be used to abort a write operation.

From the above it is apparent that the switch of the present invention may operate in a what may be called a switch mode wherein data is communicated from an addressed source to an addressed destination. In the switch mode, new words are not entered into the memory array nor are words unassigned. A timing diagram showing the relationship of the various signals used in the switch mode of operation is shown in FIG. 7.

Referring to FIG. 7, it is seen that the switch may be operated in cycles of 16 time slots, TS, numbered 0 to 15. The time slots are established by the master counter 36, which is driven by a clock signal CLK. The number of time slots required for the operation of the switch is determined by the number of sources and destinations. The timing arrangement, as shown in FIG. 7, allows for five sources, S1 to S5, amd six destinations, D1 to D6. It is to be understood that these sources and destinations are not necessarily physical or spacially related ports but may be time switched sources and destinations having a timed relationship. The sources and destinations may be a combination of space and time such as where a physical port receives or transmits timed channels of information. A source and destination could be on the same physical port which is time divided into a source time and destination time, during which signals are received and transmitted. In fact, time slots 0 to 15 could represent the time division of one channel time during which the data, to or from the spacially related ports are time division multiplexed onto the data bus 32.

As in the example of the co-pending application Ser. No. 682,228 and Ser. No. 682,038 previously referred to, each port could be passing various numbers of channels, as for example up to 32 channels sequentially repeated with each repetition defining a frame. Thus, time slots 0 to 15 would be recycled during each channel so that each physical port could be sampled at least once per channel time.

As can be seen from FIG. 7, time slots 0 to 12 are used to accomplish the switching operation and it is during these time slots that the switch is operating in a switch mode. During time slots 13 through 15, the switch is operating in what is known as the command mode, which will be described subsequently.

In FIG. 7, there are shown cross hatched portions for signals D COMP OUT, D-BUSY, S COMP OUT and S-BUSY. These cross hatched portions indicate that the signal level may or may not change, depending whether a particular condition exists. As for example, D COMP OUT and S COMP OUT are shown at a logic level 1, resulting from the D C PRG and S C PRG precharge signals which cause the compare out lines to be precharged to a logic level 1. Upon the occurance of the COMP D or COMP S signal, a compare operation takes place and the D COMP OUT and S COMP OUT signals may or may not drop to the logic level 0 depending upon whether a comparison is found between the compared signals. Likewise, the D-BUSY and S-BUSY signals are dependent upon the level of the D COMP OUT and S COMP OUT signals; however, these signals are only used during the command mode and their status during the switch mode is irrelevant.

Signal NCH only goes to logic level 1 during the switch mode of operation from the middle of time slot 1 to the end of time slot 12. Thus, the NCH signal enables the switch mode of operation.

The first step in performing a switching operation is to write data from a source into the data RAM portion 24 of a word identified by the address of the source being stored in the source CAM portion 38. In order to achieve this a source address compare is done in the source CAM portion 38 by comparing an address on the address bus with all of the source addresses stored in the source CAM portion 38 for each of the words. The S C PRG signal is applied in the source bus logic interface logic 42 for each of the bit line pairs to drive the bit lines to a logic level 0. Simultaneously the S C PRG signal is also applied to transistor 124 to precharge the compare output line 58 to a logic level 1, as illustrated in FIG. 7 by the S COMP OUT signal going to a logic level 1 in the first half of time slot 2. During the second half of time slot 2 a COMP S signal is applied to the source bus interface logic 42 to allow the bits in the address bus to be applied to the bit lines of each source CAM cell thereby initiating a compare operation. If the address on the address bus compares with any address stored in the source CAM portion 38, the COMP OUT line 58 of the particular word will remain at a logic level 1, while the S COMP OUT signal for all other words will drop during the COMP S signal to a logic level 0. If a comparison is made, the logic level 1 will appear on line 58, shown in FIG. 5, and will be applied to gate 136. Also appearing on gate 136 will be logic level 1 signals from NCH and from the source inhibit cell 184. These signals remain at gate 136 until the next clock pulse appears in time slot 3, at which time gate 136 provides a source word line, S WL1 at a logic level 1 to the word line 28 in FIG. 5, thereby enabling all of the RAM cells in data RAM portion 24. At this time the signal from source S1 which has the address that was compared to the source CAM portion 38, appears on the TDM data bus and the DWR signal is applied to the read/write logic circuit 30 causing the data on the data bus to be written into the enabled RAM cells of the addressed word. Prior to application of the DWR signal to the read/write logic circuit 30, a PRG RAM signal is applied to the read/write logic circuit 30 to precharge each of the RAM bit lines to a logic level 1. Thus, we have now stored the data appearing at souce S1 in the data RAM portion 24 in a particular word storing the source address.

The data stored in the RAM portion 24 will be read out to a destination the address of which is stored in the destination CAM portion 48 of the word. This is achieved by presenting a destination address such as destination D2 in time slot 3 on the destination address bus. This destintion address must be compared with all of the destination addresses stored in the destination CAM portion 48. The first step in accomplishing this is the application of the D C PRG signal to the destination bus interface logic 50, which causes all of the bit lines to be discharged to logic level 0 and the compare output lines 62 of each word to be precharged to a logic level 1, as indicated by D COMP OUT going to a logic level 1 during the first half of time slot 3 in FIG. 7. A COMP D signal is then applied to the destination bus interface logic 50 to initiate the compare operation during the second half of time slot 3. As a result of the compare operation, the D COMP OUT signal will either remain at a logic level 1 if a comparison is made or will drop to logic level 0 for the words in which there is no comparison. For the word in which a comparison is made the D COMP OUT logic level 1 signal will be applied to gate 134 along with a logic level 1 signal from NCH. These signals are held to the next clock pulse CLK during time slot 4 when gate 134 will provide a destination word line, D WL1, at a logic level 1 to word line 28, thereby enabling the RAM cells of the data RAM portion 24 for the addressed word. During this period, namely time slot 4, destination D2 is connected to the TDM data bus, as shown in FIG. 7, thereby completing the switching operation of data from a source having an address stored in a particular word to a destination having an address stored in the same word.

It should be noted that it is possible to have a source address and no destination address thereby storing information for later use. In certain cases permanent data could be stored in a word with the data being read out to a destination address while the word has no source address.

It should be noted that the assign bit is compared to a logic level 1 at the same time that the destination CAM is compared as a result of the COMP D signal being applied to both the assign bit and the destination CAMs. If the assign bit contains a logic level 0, no comparison will take place and the COMP OUT line 63 of the assign bit will drop to a logic level 0 during the COMP D signal. The signal on the COMP OUT line 63 of the assign bit is used in conjunction with the assign priority logic 148 and is gated to buffer 160 through transistor 158, which is turned on by the AC ADDR signal which occurs only in time slot 1. Thus, the AC ADDR signal gates the COMP OUT signals from lines 63 of all the words to the assign priority logic 148 which operates as previously described and results in an AC BUSY signal of 1 or 0. If all words are assigned AC BUSY will be at a logic level 1 and will remain there. If during the prior command mode a word was unassigned and all words had previously been used, AC BUSY will drop from the logic level 1, to logic level 0 as shown by the solid line in FIG. 7. If during the prior command mode a word was assigned using up the last unassigned word, AC BUSY will rise to a logic level 1 as shown by the dashed line in FIG. 7. The change in logic level of AC BUSY may take place any time during time slots 1 to 12 due to the variable delay of the assign priority logic in sensing an unused word. It is only essential that AC BUSY be valid prior to the command mode.

Figure 8:
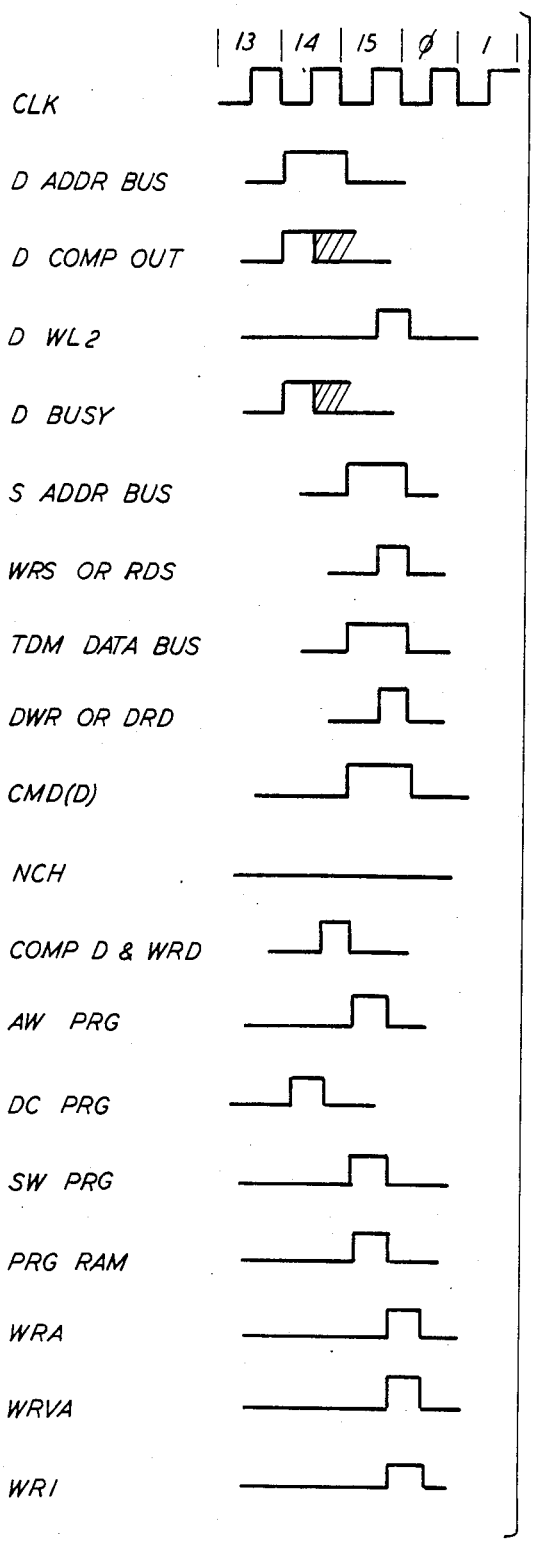

The command mode of operation, takes place during time slots 13 through 15 and signal timing is shown in FIGS. 8 and 9. During the command mode, activities such as assigning a new word take place by writing in the source address, destination address, data and the assign bit. Additional commands that may take place during the command mode include the unassignment of a word and the use of either the source or destination CAM as an address for reading or writing the other CAM portion and/or the data RAM.

During the command mode of operation, source and destination compare procedures will take place and the source and destination COMP OUT signals will on many occasions go to the logic level 1. It may not be desirable during the command mode of operation to enable the RAM cells of the data RAM portion 24 of the memory array; therefore, gates 134 and 136 shown in FIG. 5 receive signal NCH at a logic level 0 during the command mode to be certain the gates do not turn on.

Referring to FIG. 8, there is shown the command mode timing for command operations when a destination is used as an address for a read or write operation on the source CAM and/or the data RAM. One can also write to the assign bit, unassign RAM and source inhibit RAM using this operation.

A destination address appears on the destination address bus during time slot 14 and is therefore at the input to the destination bus interface logic 50. The D C PRG signal discharges the bit lines and causes the D COMP OUT line 62 to precharge to a logic level 1. In the second half of time slot 14, a COMP D signal is provided at a logic level 1 to initiate the compare operation. If a comparison is found, the D COMP OUT stays at a logic level 1. If no comparison is made, the D COMP OUT will drop to a logic level 0 during the second half of time slot 14. Immediately following the compare operation in time slot 15, the CMD (D) signal is provided to gate 138. Gate 138 in response to the CMD (D) signal the D COMP OUT signal and CLK provides a signal, D WL2, to line 98 at a logic level 1. Signal D WL2 on line 98 enables all CAM and RAM cells. As the CMD (D) signal is provided the source address bus, S ADDR BUS, presents a source address to the source CAM's. Simultaneously the TDM data bus may also provide data to the data RAM portion. During the second half of time slot 15 when the source address bus and data bus are presenting an address and data to their respective portions, a WRS signal and a DWR signal may be provided respectively to write the source address to the source CAM's and data to the data RAM's. Alternatively, a RDS signal and a DRD signal could be provided to read the source CAM's or data RAM's. It should also be remembered while all of the CAM's and RAM's are enabled, one can write to the assign bit, unassign RAM and source inhibit RAM using signals WRA, WRUA and WRI.

While the above has been described using the destination as an address, it should be remembered that the source address could also be used to perform a read or write of the destination CAM and the data RAM.

Referring to FIG. 9, there is shown the timing of the various signals for the command mode when performing the assignment of a new word, including the operations of writing into the source CAM, destination CAM, data RAM and assign bit. The destination and source addresses are presented to their respective CAM's from the address buses for two time slots, namely 14 and 15. During the first half of time slot 14 while the address buses are presented to the CAM portions, the bit lines are discharged by providing signals S C PRG and D C PRG. Simultaneously during the first half of time slot 14 the COMP OUT lines are precharged to the logic level 1. Comparisons are then initiated by providing the COMP D and COMP S signals immediately after then S C PRG and D C PRG signals. While the COMP D and COMP S signals are applied D COMP OUT and S COMP OUT remain at the logic level 1 or drop to the logic level 0 depending on whether there is a comparison. During this comparison, the CMD (S) and CMD (D) signals are held at a logic level 0 to prevent a S COMP OUT or D COMP OUT signal from appearing at word line 98 in FIG. 5, and enabling the cells.

At the beginning of the switch mode in time slot 1 AC ADDR was provided to initiate the assign priority logic. If there was an open word AC BUSY will be at a logic level 0 and gate 164 of the highest priority unassigned word will be receiving a logic level 1 signal from the assign priority logic. We will assume that the compared addresses on D ADDR BUS and S ADDR BUS were not found in the CAMs and that D COMP OUT and S COMP OUT both dropped to logic level 0 in all words. This would cause the D BUSY and S BUSY signals to also drop to logic level 0 indicating that the new source and destination addresses are not stored in either the source or destination CAM portions. If D BUSY and S BUSY remained at a logic level 1 the subsequent write operation would be aborted.

If all of the above conditions are met, then the AC signal goes to a logic level 1 during time slot 15. The AC signal on gate 164 of the highest priority available word, which will be receiving a logic level 1 from the assignment priority logic, will turn on gate 164 at the next positive CLK signal thereby providing word line 98 with signal, WL2 at a logic level 1 enabling all of the CAM and RAM cells for the word. The write operation may now take place by providing a logic level 1 during the second half of time slot 15 on signals WRS, WRD, DWR and WRA, thereby causing the source address to be written into the source address portion, the destination address to be written to the destination address portion, the data to be written to the RAM and the assign bit to be written with a logic level 1. Of course, prior to the write operation the necessary precharge signals S W PRG, D W PRG, A W PRG and PRG RAM are provided in the first half of time slot 15.

From the above, it is evident that the present invention can, in its most basic form, provide a plurality of preassigned switch paths. The invention also provides for the dynamic establishment of switch paths, which paths may be assigned and unassigned in response to commands. The invention may establish switch paths between spacial ports and timed channels of said ports. Thus, the invention provides an extremely flexible switch for both space and time switching.

What is claimed is:

1. A memory array, comprising:
    a first CAM:
    a RAM; and
    a second CAM, portions of the first CAM, RAM and second CAM being associated to form a means for storing a word, the first and second CAM portions of each word storing means including means for storing addresses for a word, whereby the RAM portion of any word storing means may be accessed using one of the addresses stored in the first and second CAM portions of the word storing means.

2. A memory array as described in claim 1, wherein the CAM portions and RAM portion of each word storing means comprise a plurality of cells for storing a plurality of bits.

3. A memory array as described in claim 1, additionally comprising:
    means for addressing the first CAM with an address;
    means for addressing the second CAM with an address; and
    means for writing to and reading from the RAM, whereby information may be written into or read from the RAM portion of a word storing means by addressing either CAM with an address of the word stored in the addressed CAM.

4. A memory array as described in claim 3, wherein each CAM additionally comprises means for comparing an address addressed to the CAM with addresses stored in the CAM to determine if the compared address is stored in the CAM and in response to the presence of the compared address in the CAM portion of one of said word storing means, a signal is provided to the RAM portion of the word storing means enabling the RAM portion to be written into or read from.

5. An information switch, comprising:
    a first CAM;
    a RAM;
    a second CAM, portions of the first CAM, RAM and second CAM being associated to form a means for storing a word;
    means associated with said first and second CAM portions for storing addresses for words, said first CAM portions storing addresses of information sources and said second CAM portions storing addresses of information destinations;
    means for addressing said first CAM with an address;
    means for addressing said second CAM with an address;
    means for writing to and reading from the RAM including means for connecting the RAM to information sources and destinations, whereby each word storing means is capable of establishing a path between an information source and an information destination, said paths being established by addressing the first CAM with a source address to access the RAM portion of a word storing means containing the source address, connecting the RAM to the addressed source, writing information from the addressed source into the RAM portion of the word storing means containing the source address while the RAM portion is accessed, addressing the second CAM with a destination address to access the RAM portion of a word storing means containing the destination address, reading information from the RAM portion of the word storing means that is addressed while the RAM portion is accessed and connecting the RAM portion to addressed destination to provide the information to the destination.

6. A switch as described in claim 5, wherein the means for addressing the first CAM comprises a plurality of clocks and registers for generating and storing source addresses; and the means for addressing the second CAM comprises a plurality of clocks and registers for generating and storing destination addresses.

7. A switch as described in claim 6, additionally comprising a synchronizing means for causing the means for addressing the first CAM to address the CAM with a selected source address in timed relation to the RAM being connected to the selected addressed information source and for causing the means for addressing the second CAM to address the second CAM with a selected address in timed relationship to the RAM being connected to an information destination having the selected address.

8. A switch as described in claim 5, wherein the information sources and information destinations comprise physical ports whereby the switch functions as a spacial switch.

9. A switch as described in claim 8, wherein said ports receive PCM information in timed channels, whereby the sources and destinations become channels of ports and the switch functions as a time and space switch.

10. A switch as described in claim 5, additionally comprising:
   means for time division multiplexing source addresses to the means for addressing the first CAM;
   means for time division multiplexing destination addresses to the means for addressing the second CAM; and
   the means for connecting the RAM to the sources and destinations comprises a time division multiplexing means.

11. A switch as described in claim 10, additionally comprising means for synchronizing the time division multiplexing means so that a source address addresses the first CAM in timed relationship to the source being connected to the RAM and the destination address is addressed to the second CAM in timed relationship to the RAM being connected to the destination.

12. A switch as described in claim 5, additionally comprising means for assigning word storing means to sources and destinations to thereby establish paths between said sources and destinations said means including means for writing source and destination addresses into the CAM portions of word storing means.

13. A switch as described in claim 12, additionally including means for unassigning word storing means from sources and destinations whereby switch paths may be dynamically assigned and unassigned.

14. A switch as described in claim 13, additionally comprising means for determining if there is an available unassigned word storing means in the array to which addresses may be written.

15. A switch as described in claim 14, wherein the means for determining if there is an available unassigned word storing means further comprises means for determining the highest priority unassigned word and for assigning said word to the next available word storing means so that a source to destination path may be established.

16. A switch as described in claim 15, additionally comprising means for inhibiting the writing of information to the RAM upon the first addressing of a newly written source address until after the destination address of the word has been addressed and the RAM read.

17. A switch as described in claim 12, additionally comprising means for preventing the same address from being stored more than once in a CAM.

18. A switch as described in claim 12, additionally comprising means for reading addresses stored in said first and second CAM's.

19. A switch for providing paths between a plurality of sources and destinations, comprising:
   a memory array having a plurality of word storage means, each word storage means, including a first CAM portion, a RAM portion and a second CAM portion;
   means for addressing the first CAM portions;
   means for addressing the second CAM portions; and
   means for writing to and reading from the RAM portion, whereby addresses of sources may be stored in the first CAM portions, and addresses of destinations may be stored in the second CAM portions so that the first CAM portions may be addressed with a source address to gain access to the word and enable its RAM portion allowing information from a source to be written into the RAM portion which information may be read from the RAM portion by subsequently addressing the second CAM portions with the destination address to gain access to the word and enable the RAM to be read to the destination.

20. A method of switching data from a source to a destination using a memory array of the type that has a first CAM, a RAM and a second CAM, portions of the first CAM, RAM and second CAM being associated to form a means for storing a word with the CAM portions of each word storing means storing addresses for the word so that the RAM portion of any word storing means may be accessed using addresses stored in the CAM portions, said method comprising the steps of:
   storing a source address in the first CAM portion of a word storing means;
   storing a destination address in the second CAM portion of a word storing means;
   accessing the RAM portion of the word storing means by addressing the first CAM portion of the word storing means with a source address;
   while accessing the RAM portion of the word storing means writing in said RAM portion data appearing at the addressed source;
   addressing the second CAM portion of the word storing means with a destination address thereby accessing the RAM portion of the addressed word storing means; and
   reading the data in the RAM portion to the addressed destination.

21. A method as described in claim 20, wherein the addressing of the first and second CAM portions is achieved by time division multiplexing source and destination addresses to the CAM portions.

22. A method as described in claim 20, wherein writing and reading data to and from the RAM portion is accomplished by time division multiplexing of the data from and to sources and destinations.

23. A method as described in claim 20, wherein the step of storing a source address includes writing a source address into first CAM portion.

24. A method as described in claim 20, wherein the step of storing a destination address includes the step of writing a destination address into the second CAM portion.

* * * * *